US006709564B1

(12) United States Patent
Tench et al.

(10) Patent No.: US 6,709,564 B1
(45) Date of Patent: Mar. 23, 2004

(54) INTEGRATED CIRCUIT PLATING USING HIGHLY-COMPLEXED COPPER PLATING BATHS

(75) Inventors: D. Morgan Tench, Camarillo, CA (US); John T. White, Lancaster, CA (US); Dieter Dornisch, Carlsbad, CA (US); Maureen Brongo, Laguna Hills, CA (US)

(73) Assignee: Rockwell Scientific Licensing, LLC, Thousand Oaks, CA (US)

(*) Notice: Subject to any disclaimer, the term of this patent is extended or adjusted under 35 U.S.C. 154(b) by 229 days.

(21) Appl. No.: 09/410,250

(22) Filed: Sep. 30, 1999

(51) Int. Cl.$^7$ ................................................. C25D 3/38
(52) U.S. Cl. ....................... 205/291; 205/293; 205/296; 205/298
(58) Field of Search ................ 205/291, 293, 205/296, 298

(56) References Cited

U.S. PATENT DOCUMENTS

| | | | | |
|---|---|---|---|---|
| 3,674,660 A | * | 7/1972 | Lyde | ................ 204/52 R |
| 4,132,605 A | | 1/1979 | Tench et al. | |
| 4,469,564 A | * | 9/1984 | Okinaka et al. | ............. 204/15 |
| 4,683,036 A | * | 7/1987 | Morrissey et al. | ........... 204/15 |
| 4,789,648 A | | 12/1988 | Chow et al. | |
| 5,209,817 A | | 5/1993 | Ahmad et al. | |
| 5,368,711 A | * | 11/1994 | Poris | ................ 204/193 |
| 5,616,230 A | * | 4/1997 | Otsuka et al. | ............... 205/125 |
| 5,958,209 A | * | 9/1999 | Sakai et al. | ................. 205/585 |
| 5,972,192 A | * | 10/1999 | Dubin et al. | ................ 205/101 |

OTHER PUBLICATIONS

Kelly, James J. et al, "Leveling and Microstructural Effects of Additives for Copper Electrodeposition", *Journal of The Electrochemical Society*, (1999), 146 (7), pp. 2540–2545, no month available.

Andricacos, Panos C., "Copper On–Chip Interconnections", (1999), *The Electrochemical Society Interface*, pp. 32–37. no month available.

Haak, Ronald, et al., "Comparison of the Tensile Properties of Electrodeposits From Various Acid Copper Sulfate Baths", (1981), *Plating Surf. Fin. 68(10)*, pp. 59–62. no month available.

Abe, Kazuhide, et al., "Cu Damascene Interconnects with Crystallographic Texture Control and its Electromigration Performance",(1998) , *IEEE 98CH36173.36 Annual International Reliability Physics Symposium*, pp. 342–347. no month available.

Tench, Dennis, et al., "A New Voltammetric Stripping Method Applied to the Determination of the Brightener Concentration in Copper Pyrophosphate Plating Baths", (1978), *J. Electrochem. Soc: Electrochemical Science and Technology*, vol. 125, No. 2, pp. 194–198. no month available.

Ryu, Changsup, Kwon, Kee–Won, et al., "Electromigration of Submicron Damascene Copper Interconnects", (1998), *Symposium on VLSI Technology, Jun. 8–11, 1998*.

197 Surface Treatment Technology Abstracts 34 (1992) Jul./Aug., No. 4, Teddington, Midddlesex, GB, *A New Periodic Displacement Method Applied to Electrodeposition Of Cu–Ag Alloys*, Tench et al.

J. Electrochem. Soc: Electrochemical Science and Technology, Aug. 1978, p. 1218–1224, XP–000972910 *On The Functioning and Malfunctioning Of Dimercaptothiadiazoles as Leveling Agents In Circuit Board Plating From Copper Pyrophosphate Baths*, Tench et al.

Nitta, Takahisa, "Evaluating the Large Electromigration Resistance of Copper Interconnects Employing a Newly Developed Accelerated Life–Test Method", (1993) *J. Electrochem. Soc.*, vol. 140, No. 4, pp. 1131–1137. no month available.

Ryu, Changsup, et al., "Effect of Texture on the Electromigration of CVD Copper", (1997), *IEEE Int. Rel. Phys. Symp Proc.*, pp. 201–205. no month available.

Cerisier, M., et al., "Growth Mode of Copper Films Electrodeposited on Silicon from Sulfate and Pyrophosphate Solutions", *Journal of the Electrochemical Society*, 146(6), pp. 2156–2162, no month available.

* cited by examiner

Primary Examiner—Wesley A. Nicolas
(74) Attorney, Agent, or Firm—Koppel, Jacobs, Patrick & Heybl

(57) ABSTRACT

The acid copper sulfate solutions used for electroplating copper circuitry in trenches and vias in IC dielectric material in the Damascene process are replaced with a type of plating system based on the use of highly complexing anions (e.g., pyrophosphate, cyanide, sulfamate, etc.) to provide an inherently high overvoltage that effectively suppresses runaway copper deposition. Such systems, requiring only one easily-controlled organic additive species to provide outstanding leveling, are more efficacous for bottom-up filling of Damascene trenches and vias than acid copper sulfate baths, which require a minimum of two organic additive species. The highly complexed baths produce fine-grained copper deposits that are typically much harder than large-grained acid sulfate copper deposits, and which exhibit stable mechanical properties that do not change with time, thereby minimizing "dishing" and giving more consistent CMP results. The mechanical properties and texture of the fine-grained deposits are also much less substrate dependent, which minimizes the effects of variations and flaws in the barrier and seed layers. The resistivity of pyrophosphate and annealed acid sulfate copper deposits are approximately equivalent.

14 Claims, No Drawings

INTEGRATED CIRCUIT PLATING USING HIGHLY-COMPLEXED COPPER PLATING BATHS

BACKGROUND OF THE INVENTION

This invention is concerned with copper plating for the metallization of integrated circuits (ICs).

The electronics industry is in the process of transitioning from aluminum to copper as the basic metallization for semiconductor IC's. The higher electrical conductivity of copper reduces resistive losses and enables the faster switching needed for future generations of advanced devices. Copper also has a higher resistance to electromigration than aluminum. The leading technology for fabricating copper circuitry on semiconductor chips is the "Damascene" process (see, e.g., P. C. Andricacos, Electrochem. Soc. Interface, Spring 1999, p.32; U.S. Pat. No 4,789,648 to Chow et al.; U.S. Pat. No 5,209,817 to Ahmad et al.). Under this process, vias are etched through and trenches are etched in the chip's dielectric material, which is typically silicon dioxide, although materials with lower dielectric constants are desirable. A barrier layer, e.g., titanium nitride (TiN) or tantalum nitride (TaN), is deposited into the trenches and vias by reactive sputtering, to prevent Cu migration into the dielectric material and degradation of the device performance. A thin sputtered copper seed layer is deposited next, to facilitate copper electrodeposition. Copper is then electrodeposited into the trenches and vias. Copper deposited on the outer surface, i.e., outside of the trenches and vias, is removed by chemical mechanical polishing (CMP). The "dual Damascene" process involves deposition in both trenches and vias at the same time.

Electrodepositing copper into trenches and vias as required by the Damascene process has proven to be difficult, particularly with respect to the bottom-up filling of small features which are often submicron in size. Until now, copper electrodeposition efforts have focused on adopting the acid copper sulfate plating system currently used for most circuit board plating. However, acid copper sulfate baths have significant disadvantages for chip plating. A major disadvantage is that the sulfate anions used in acid copper sulfate systems do not complex copper ions very well. This allows the copper to plate out at a low voltage, which, unless suppressed, can result in runaway deposition that can lead to powdery or nodular deposits. To prevent this while providing the leveling power needed for bottom-up filling of the chip features, a relatively complicated additive system with at least two additive components is required. One essential component, the suppressor, is typically a polymeric organic species, e.g., high molecular weight polyethylene glycol, that adsorbs strongly on the copper electrode surface, forming a film which sharply suppresses the deposition rate. The other essential acid copper sulfate additive component, the anti-suppressor, counters this suppressive effect to provide the mass-transport-limited rate differential needed for leveling and bottom-up filling of the chip features. Note that additive species typically are present in small concentrations and are consumed during the metal electrodeposition process, so that they become depleted at the cathode surface unless they are replenished by vigorous solution agitation. Ideally, depletion of suppressor additive species results in faster metal deposition within trenches and vias, where solution agitation is less effective. For the acid copper sulfate system, however, a delicate balance between the effects of the two types of additive components must be maintained for consistent results. This is further complicated by the involvement of other species in the leveling process of practical acid copper sulfate systems.

Proprietary acid copper sulfate baths presently in use typically contain chloride ion and involve two additive component solutions, at least one of which contains more than one compound. A recent study (J. J. Kelly, C. Tian, and A. C. West, J. Electrochem. Soc. 146 (7) (1999), p. 2540) showed that adequate leveling occurs only when all four constituents of a model additive system (chloride, polyethylene glycol suppressor, and two anti-suppressing compounds) were present. The difficulty of adequately controlling the concentrations of the various additive species (and of taking into account additive-additive interactions) limits the efficacy of acid copper sulfate for uniform plating of high aspect ratio features.

Another disadvantage of acid copper sulfate systems is that they provide relatively soft deposits having mechanical properties which are highly dependent on the substrate (i.e., the barrier and seed layer materials) (R. Haak, C. Ogden, and D. Tench, Plating Surf. Fin. 68 (10) (1981), p. 59; K. Abe, Y. Harada, and H. Onoda, IEEE 98CH36173 Ann. Int. Rel. Phys. Symp. (1998), p. 342), and which change with time at room temperature. Changing properties make it difficult to control the CMP process used to remove excess copper and planarize the wafer in the Damascene fabrication process. In addition, polishing tends to recess ("dish") the soft copper in relatively wide trenches and bond pads, so that the planarity needed to facilitate bonding and minimize circuit electrical resistance is lost. Soft copper also tends to exacerbate CMP erosion of copper and dielectric material in clusters of closely-spaced narrow trenches.

SUMMARY OF THE INVENTION

A type of electrolytic solution for electroplating copper circuitry in trenches and vias of IC's is presented which overcomes the problems noted above. This type of solution provides good deposits even without organic additives, and requires only one organic additive species to provide outstanding leveling.

The invention described herein replaces the acid copper sulfate system currently used in the Damascene process with a plating system based on the use of highly complexing anions (e.g., pyrophosphate, cyanide, sulfamate, etc.) to provide an inherently high overvoltage that effectively suppresses runaway copper deposition. With the deposition naturally suppressed by an intrinsic electrolyte component that is in high concentration and is not depleted during the metal deposition process, the system requires only one organic additive species to provide the rate differential needed for good filling of chip features. Use of a single organic species greatly simplifies control of the additive concentration, and should permit bottom-up filling of Damascene trenches and vias having higher aspect ratios than can be filled with acid copper sulfate baths. In addition, highly complexed baths produce fine-grained copper deposits that are typically much harder than the large-grained acid sulfate copper deposits, and which exhibit stable mechanical properties that do not change with time, thereby minimizing "dishing" and giving more consistent CMP results. The mechanical properties and texture of the fine-grained deposits are also much less substrate dependent, which minimizes the effects of variations and flaws in the barrier and seed layers.

The preferred highly complexed bath for plating circuitry on semiconductor chips is copper pyrophosphate. The addition of a single organic compound (e.g., 2,5-dimercapto-1, 3,4-thiadiazole) to the bath provides exceptional throwing power for plating high aspect ratio features. The copper deposits that result from a pyrophosphate bath with one organic additive are extremely fine-grained and typically about twice as hard as acid sulfate copper deposits, and exhibit little or no substrate dependence. The resistivity of pyrophosphate and annealed acid sulfate copper deposits are equivalent.

DESCRIPTION OF THE INVENTION

The Damascene process involves etching trenches and vias into IC dielectric layers, which, when filled with copper, become the chip's interconnecting circuitry. The present invention provides a plating system for the electrodeposition of copper into the trenches and vias (referred to herein as chip "features"). This plating system is based on the use of anions which complex copper ions well, such as pyrophosphate, cyanide, and sulfamate. Complexing the copper ions via an intrinsic component of the solution provides an inherently high overvoltage that effectively suppresses runaway copper deposition, without the need of a complicated and difficult to control additive system. The highly complexed copper system provides fine-grained deposits which are typically much harder than large-grained acid sulfate copper deposits, and which exhibit stable mechanical properties that do not change with time. The mechanical properties and texture of the fine-grained deposits produced by the highly complexed baths are also much less substrate dependent than those produced by acid copper sulfate baths, which minimizes the effects of variations and flaws in the barrier and seed layers.

The anion used to provide a highly complexed bath per the present invention is preferably pyrophosphate, though other anions, including cyanide, thiocyanate, iodide, bromide, chloride and sulfamate, may also be acceptable. The copper pyrophosphate system was previously used extensively for circuit board plating, but was replaced by acid copper sulfate, largely because copper pyrophosphate baths are more susceptible to contamination by water soluble organic coatings, which were adopted for environmental reasons. Such water soluble coatings are typically not present during chip plating by the Damascene process.

Complexing the copper ions in solution with an appropriate anion serves to increase the voltage required to plate out copper. This inherently high overvoltage effectively suppresses runaway deposition, thereby avoiding the powdery or nodular deposits associated with such uncontrolled growth. This approach is superior to that used with acid copper sulfate systems in that deposition is suppressed by a bulk solution stabilization effect produced by use of a natural counter ion. In contrast, an acid copper sulfate system uses one or more organic additives to form a film at the surface of the electrode to suppress deposition, which then necessitates the use of additional additives to counter the suppressive effect and provide the mass transport-limited rate differential needed for leveling and bottom-up filling of the chip features. The mechanism by which acid copper sulfate additive systems function is complicated and not well-understood.

Though copper pyrophosphate does not require the use of organic additives to provide good quality deposits, the addition of a single organic compound to the bath provides exceptional throwing power, enabling bottom-up filling of high aspect ratio features. The organic compound should contain at least one chemical element selected from a group consisting of sulfur, nitrogen and phosphorous, with 2,5-dimercapto-1,3,4-thiadiazole being preferred. The organic compound operates by affecting the rate of copper electrodeposition (typically further decelerating the deposition rate) so as to provide the rate differential needed to provide good filling of chip features. The effective concentration of the organic compound is readily controlled by the cyclic voltammetric stripping (CVS) method alone (described, for example, in D. Tench and C. Ogden, J. Electrochem. Soc. 125 (2), p. 194 (1978)), whereas for acid copper sulfate baths, the CVS method must usually be combined with other methods to accurately determine the concentrations of all additive components that must be controlled.

The copper deposits produced by the described pyrophosphate and organic compound-containing bath are extremely fine-grained, and typically about twice as hard as acid sulfate copper deposits. The deposits exhibit little or no substrate dependence, and their resistivity is equivalent to that of annealed acid sulfate copper deposits.

Another advantage of the present electrolytic solution is the ready availability of well-characterized copper pyrophosphate formulations, affording the user complete control of the plating process. In contrast, the acid copper sulfate formulations in use are proprietary in nature, diminishing control by the user.

The present pyrophosphate-based plating system is superior to prior art acid copper sulfate systems in terms of both simplicity and performance. For the acid copper sulfate systems, runaway deposition, which can cause powdery and nodular deposits, is suppressed through adsorption of a first organic additive on the surface of the copper electrode to form a film which slows copper electrodeposition at the surface. However, this suppressive effect alone does not provide the leveling of surface peaks and the bottom-up deposition needed for complete filling of the chip features. Thus, another additive component must be added to the solution to counter the suppressive effect of the organic surface film so as to provide the mass-transport-limited rate differential needed to accelerate deposition at the bottom of the chip features and decelerate it at the top, which is needed to provide the necessary leveling and bottom-up filling. As noted in the study cited above (J. J. Kelly et al., ibid), for acid copper sulfate plating systems, leveling occurred only when all four constituents of a model additive system (chloride, polyethylene glycol suppressor, and two anti-suppressing compounds) were present. The difficulty of adequately controlling the concentrations of the various additive species and of taking into account additive-additive interactions in a dynamic system involving consumption and mass transport balances limits the efficacy of acid copper sulfate for uniform plating of high aspect ratio features.

In contrast, plating systems based on the use of highly complexing anions (as described herein) provide deposits as good or better than those provided by acid copper sulfate baths, but are much simpler and easier to control. Instead of the suppressor/anti-suppressor push/pull mechanism used for acid copper sulfate baths, anions that are an intrinsic part of the bath and present at high concentrations naturally slow the deposition process by increasing the overvoltage, and a single organic additive species is used to provide the mass-transport-limited additional suppression needed for enhanced leveling and bottom-up filling of IC features. The degree to which the overall copper deposition rate is slowed can be increased by using an excess of the complexing anion, above the stoichiometric ratio for the copper compound. This anion excess, which also increases the overall bath stability, can be attained by addition of a salt of the anion with an unreactive cation that is not appreciably complexed by the anion (e.g., $K^+$, $Na^+$, $NH_4^+$, etc.).

Pulse plating, or periodic reverse pulse plating, can be used with both the acid sulfate and highly-complexed systems to improve copper deposit quality and leveling, particularly at higher average current densities. However, organic additives, at least of the types typically used, tend to be consumed in acid sulfate systems under alternating current (ac) conditions at a much faster rate, making control of additive concentrations and bath purity more difficult. This restricts the options in terms of additive types and operating conditions for pulse plating from acid sulfate systems. The relatively simple organic additives used in highly complexed baths tend to be less sensitive to ac decomposition.

Typical characteristics of the copper pyrophosphate and the prior art acid copper sulfate systems are compared in Table 1.

TABLE 1

Copper Plating System Comparison

| Acid Sulfate | Pyrophosphate |
| --- | --- |
| Strongly acidic solution (pH <1) | Weakly alkaline (pH 8–9) |
| Room temperature operation | Operates 50–60° C. |
| Organic additives required | Additives optional |
| At least two additive components | Single compound additive |
| Proprietary additive system | Generic bath chemistry |
| Large columnar grain structure | Fine-grained deposits |
| Strong substrate effects | Weak substrate effects |
| Polishing may recesses soft deposit (50 KHN) | Harder deposit (90 KHN) |
| Anneals at room temperature | Stable at ambient temperatures |
| Resistivity decreases (>2 to 1.7 $\mu$ohm-cm) | Constant resistivity 1.7 $\mu$ohm-cm |

A problem faced by both acid sulfate and pyrophosphate systems is the formation of undesired copper oxide on the surface of the seed layer, which can reduce adhesion of the electrodeposited copper, and may cause "skip plating" or voids in the deposit. One potential disadvantage of the copper pyrophosphate system is that copper oxide in the alkaline pyrophosphate solution dissolves slower than it would in the acidic sulfate solution. In addition, poor wetting of the copper oxide layer by the plating solution may result in incomplete displacement of air in small trenches and vias, resulting in incomplete filling or voids. Note that the sulfamate anion, which complexes copper reasonably well, is stable in mildly acidic solutions and could be used for Damascene copper plating with a simple additive system. The advantage of faster seed layer oxide dissolution in this case would be offset in the short term by the limited information available on copper electroplating from sulfamate electrolytes.

However, oxide removal and good wetting of the copper seed layer can be attained for the copper pyrophosphate system in a variety of ways. Of course, positioning the wafer in the plating tool vertically or with the side to be plated facing upward would mitigate the tendency to trap air in trenches and vias since the bubbles could then rise unimpeded under the influence of gravity. This may not always be practical for automated equipment, however. One approach to facilitating wetting and dislodging trapped air bubbles is to direct pumped solution toward the central region of a rotating wafer. The wafer can also be rotated at a fast rate, at least initially or prior to plating, in the solution to displace air by centrifugal force. The simplest approach is to simply allow enough time prior to applying the plating current for the oxide to dissolve in the pyrophosphate solution, which should be effective for relatively thin oxide layers. A small cathodic voltage may also be used to help remove oxide via reduction.

Thicker oxides can readily be electrochemically reduced in electrolytes containing no copper ions or other reducible species. In this case, use of a potassium pyrophosphate solution of the appropriate pH avoids the possibility of contaminating the copper pyrophosphate plating bath. Of course, copper surface oxides can also be dissolved chemically in an acidic solution prior to plating. It may also be possible to adjust the bath composition or add species to the plating solution to facilitate seed layer oxide dissolution/reduction. Ammonia is typically added to copper pyrophosphate baths to aid anode dissolution (and to improve deposit quality), and its concentration could be increased to accelerate copper oxide dissolution.

The teachings of the prior art have counseled against the approach described herein. Highly complexed copper systems have not been investigated previously for Damascene chip plating applications, apparently because they provide fine-grained deposits which are reported to degrade resistance to electromigration (see, e.g., C. Ryu, K. Kwon, A. L. S. Loke, J. M. Dubin, R. A. Kavari, G. W. Ray, and S. S. Wong, Symp. on VLSI Tech. (Jun. 8–11, 1998)). Early work (e.g., T. Nitta, J. Electrochem. Soc. 140 (4), 1131 (1993)) showed that acid sulfate copper deposits have a higher activation energy for electromigration after annealing, which increases the grain size. Acid sulfate copper deposits are routinely annealed for Damascene applications, to enhance electromigration resistance and to stabilize the properties for more consistent CMP results. Other studies have compared large-grained acid sulfate copper deposits with vacuum-deposited or chemical-vapor-deposited (CVD) materials which are of only moderate grain size, and found that the large-grained materials have higher resistance to electromigration.

Contrary to these teachings, the present inventors believe that the fine-grained deposits obtained from copper baths with highly complexing anions will prove to have good electromigration resistance. For example, the CVD materials of moderate grain size tend to contain micro-voids (indicated by less than theoretical density), which would greatly increase electromigration. On the other hand, deposits from highly complexed baths (e.g., copper pyrophosphate) containing organic additives typically approach theoretical density (indicating minimum void volume), and are extremely fine-grained. Furthermore, the high density of the "necks" which connect the crystallites together in such deposits should actually inhibit copper atom motion and impede electromigration.

Note that the annealing shown to increase grain size for acid sulfate copper deposits may also produce other structural changes that affect electromigration. For example, growth of some grains at the expense of others would tend to eliminate voids and change the crystallographic texture. A strong {111} orientation in CVD copper has been shown (C. Ryu, A. L. S. Loke, T. Nogami, and S. S. Wong, IEEE Int. Rel. Phys. Symp. Proc., p. 201 (1997)) to enhance electromigration resistance relative to that of a Cu{200} texture, but the effect of annealing on the texture of acid sulfate copper deposits for Damascene applications apparently has not been reported. Annealing also increases the conductivity of acid sulfate copper deposits, which is consistent with densification associated with reduction in voids.

A copper pyrophosphate system has been evaluated for plating copper on silicon for potential microelectromechanical systems (MEMS) applications (M. Cerisier, K. Attenborough, J. Fransaer, C. Van Haesendonck, and J.-P. Celis, J. Electrochem. Soc. 146 (6), 2156 (1999)). In this case, however, copper was plated directly on the silicon surface without the barrier and seed layers used to fabricate integrated circuits in the Damascene process. Deposition was also performed on a planar surface from a copper pyrophosphate bath at room temperature without organic additives, which would not be suitable for plating IC trenches and vias. These workers thoroughly characterized the morphology of the deposits obtained, but did not investigate the capability of the bath for leveling or filling IC features with copper.

At a minimum, the present electrolytic solution must include water as a solvent, copper in either the +1 or +2 oxidation state or a mixture of the two states, anions that form at least one complex ion with copper so as to significantly increase the overvoltage for copper electrodeposition, and at least one organic compound that affects the rate of copper electrodeposition. The anions should be added until the overvoltage is sufficient to prevent the formation of powdery deposits caused by runaway deposition, and the organic compound should provide the rate differential needed to provide good filling of chip features. Suitable anions for complexing copper include pyrophosphate, cyanide, thiocyanate, iodide, bromide, chloride, and sulfamate. Organic compounds suitable for use as leveling agents typically contain sulfur, nitrogen and/or phosphorous. Pyrophosphate and 2,5-dimercapto-1,3,4-thiadiazole are preferred as the anion and organic compound, respectively, for use in the solution of the present invention.

A fraction of the anions in the solution are typically derived from the addition of a salt of a metal other than copper, to provide an excess of anions to the copper above the stoichiometric amount which corresponds to the copper salt. The metal other than copper is typically unreactive electrochemically at the voltage used for the copper deposition, such that relatively pure copper metal is deposited. Alternatively, the salt used to provide excess anions can contain non-metallic cations, e.g., ammonium ions ($NH_4^+$), to avoid the presence of metallic ions other than copper in the bath, which might degrade device performance if not completely removed after plating.

Ions of an electrodepositable metal other than copper can also be added to the plating bath, such that an alloy deposit is obtained. Possible metals for this purpose include silver, zinc, cadmium, iron, cobalt, nickel, tin, lead, bismuth, antimony, gallium and indium. In this case, the metal other than copper may be selected, for example, to increase the resistance of the alloy to electromigration.

PREFERRED EMBODIMENT

The present invention can be effectively practiced using a copper pyrophosphate plating bath containing 22–38 g/L copper ions ($Cu^{2+}$), 150–250 g/L pyrophosphate ions $[(P_2O_7)^{4-}]$, 1–3 g/L ammonia ($NH_3$), and 1–3 µg/L 2,5-dimercapto-1,3,4-thiadiazole as an organic additive. The addition of 5–10 g/L nitrate ions ($NO_3^-$ may be beneficial for reducing cathode polarization. Copper ions are added as copper pyrophosphate salt, and pyrophosphate and nitrate as the copper, potassium, sodium, or ammonium salts. Ammonia may be added as the gas or ammonium hydroxide. The bath pH is adjusted by addition of phosphoric acid or potassium/sodium/ammonium hydroxide to maintain the target value in the pH 8–9 range (typically around pH 8.3). Best results are obtained by operating the bath at 40–60° C.

(typically 55° C.). The concentration of orthophosphate $[(HPO_4)^{2-}]$ derived from pyrophosphate decomposition should be maintained at less than 110 g/L by diluting or periodically dumping the bath.

The copper plating process can be performed in a laboratory apparatus, or with a commercial plating tool modified for operation at 55° C. Good results are obtained by rotating the wafer during plating and/or providing a uniform laminar flow of solution over the wafer surface via pumping the solution through a nozzle system. The wafer holder should have a seal designed to avoid solution contact with the electrical contact made to the copper seed layer around the periphery of the wafer side to be plated. The holder should be designed to have a low profile and/or other means for avoiding disruption of laminar flow over the wafer surface. Pumped solution from a nozzle is typically directed toward the center of the rotating wafer.

EXAMPLES

Coupons from an eight-inch-diameter silicon wafer having trenches and vias of various dimensions, and coated with a TaN barrier layer and a copper seed layer, were plated at 25 mA/cm$^2$ with copper (1.1 µm average thickness) in a flow cell from a copper pyrophosphate bath (operated at 55° C. and pH 8.3) containing 22.5 g/L copper ions ($Cu^{2+}$), 173 g/L pyrophosphate ions $[(P_2O_7)^{4-}]$, 2.25 g/L ammonia ($NH_3$), and 2.0 µg/L 2,5-dimercapto-1,3,4-thiadiazole as an organic additive.

The preferred embodiments of this invention have been illustrated and described above. Modifications and additional embodiments, however, will undoubtedly be apparent to those skilled in the art. Furthermore, equivalent elements may be substituted for those illustrated and described herein, parts or connections might be reversed or otherwise interchanged, and certain features of the invention may be utilized independently of other features. Consequently, the exemplary embodiments should be considered illustrative, rather than inclusive, while the appended claims are more indicative of the full scope of the invention.

What is claimed is:

1. A process for electroplating copper circuitry in trenches and vias in dielectric material on semiconductor chips, comprising:

providing a semiconductor chip which includes dielectric material in which trenches and/or vias have been formed, placing said chip in contact with an electroplating solution, said solution comprising:

water as a solvent, copper in either the +1 or +2 oxidation state or a mixture of the two states, anions that form at least one complex ion with said copper so as to significantly increase the overvoltage for copper electrodeposition such that the copper deposition rate at a given cathode voltage is suppressed, and at least one organic additive species which tends to further suppress the copper deposition rate so as to provide the rate differential needed to provide bottom-up filling of said trenches and/or vias, and electrodepositing copper in said trenches and/or vias.

2. The process of claim 1, wherein said anions include at least one anion selected from the group consisting of pyrophosphate, cyanide, thiocyanate, iodide, bromide, chloride and sulfamate.

3. The process of claim 1, wherein said organic compound contains at least one chemical element selected from the group consisting of sulfur, nitrogen and phosphorous.

4. The process of claim 1, wherein a fraction of said anions is derived from the addition of a salt containing cations other than copper ions to the solution, said salt to provide an excess of said anions to said copper above the stoichiometric amount which corresponds to the copper salt.

5. The process of claim 4, wherein said cations other than copper ions are not electroactive at the voltage used for copper deposition such that relatively pure copper metal is deposited.

6. The process of claim 5, wherein said cations other than copper ions are selected from the group consisting of $K^+$, $Na^+$, and $NH_4^+$ ions.

7. The process of claim 1, wherein said electrolytic solution further contains ions of at least one metal other than copper that is electroactive at the voltage used for copper deposition such that an alloy deposit is obtained.

8. The process of claim 7, wherein said metal other than copper includes at least one metal selected from the group consisting of silver, zinc, cadmium, iron, cobalt, nickel, tin, lead, bismuth, antimony, gallium and indium.

9. The process of claim 1, wherein said organic compound decelerates the rate of copper electrodeposition so as to provide the rate differential needed to provide bottom-up filling of chip features.

10. The process of claim 1, wherein said anions are pyrophosphate and said organic compound is 2,5-dimercapto-1,3,4-thiadiazole.

11. The process of claim 10, wherein said electrolytic solution is maintained between 40° C. and 60° C.

12. The process of claim 10, wherein said electrolytic solution has a pH of between 8 and 9.

13. The process of claim 10, wherein said electrolytic solution contains ammonia or ammonium ion to aid in complexing copper.

14. The process of claim 10, wherein said electrolytic solution contains nitrate ion as a cathode depolarizer.

* * * * *